(12) United States Patent
Takaya et al.

(10) Patent No.: US 9,276,075 B2
(45) Date of Patent: Mar. 1, 2016

(54) SEMICONDUCTOR DEVICE HAVING VERTICAL MOSFET STRUCTURE THAT UTILIZES A TRENCH-TYPE GATE ELECTRODE AND METHOD OF PRODUCING THE SAME

(71) Applicants: Hidefumi Takaya, Miyoshi (JP); Hideo Matsuki, Obu (JP); Naohiro Suzuki, Anjo (JP); Tsuyoshi Ishikawa, Nisshin (JP); Narumasa Soejima, Seto (JP); Yukihiko Watanabe, Nagoya (JP)

(72) Inventors: Hidefumi Takaya, Miyoshi (JP); Hideo Matsuki, Obu (JP); Naohiro Suzuki, Anjo (JP); Tsuyoshi Ishikawa, Nisshin (JP); Narumasa Soejima, Seto (JP); Yukihiko Watanabe, Nagoya (JP)

(73) Assignees: TOYOTA JIDOSHA KABUSHIKI KAISHA, Toyota (JP); DENSO CORPORATION, Kariya (JP)

( * ) Notice: Subject to any disclaimer, the term of this patent is extended or adjusted under 35 U.S.C. 154(b) by 49 days.

(21) Appl. No.: 14/352,142

(22) PCT Filed: Oct. 17, 2012

(86) PCT No.: PCT/IB2012/002081
§ 371 (c)(1),
(2) Date: Apr. 16, 2014

(87) PCT Pub. No.: WO2013/057564
PCT Pub. Date: Apr. 25, 2013

(65) Prior Publication Data
US 2014/0252465 A1  Sep. 11, 2014

(30) Foreign Application Priority Data

Oct. 18, 2011  (JP) ................................. 2011-229183

(51) Int. Cl.
*H01L 29/78* (2006.01)
*H01L 21/8234* (2006.01)
(Continued)

(52) U.S. Cl.
CPC ...... *H01L 29/4236* (2013.01); *H01L 21/28008* (2013.01); *H01L 21/823487* (2013.01); *H01L 29/0619* (2013.01); *H01L 29/0623* (2013.01); *H01L 29/41741* (2013.01);
(Continued)

(58) Field of Classification Search
CPC ..................................................... H01L 21/047
See application file for complete search history.

(56) References Cited

U.S. PATENT DOCUMENTS

2008/0012026 A1*  1/2008  Tsuji ............................... 257/77
2009/0114969 A1    5/2009  Suzuki et al.
(Continued)

FOREIGN PATENT DOCUMENTS

JP    A-10-98188      4/1998
JP    2007-242852 A   9/2007
(Continued)

*Primary Examiner* — Stephen W Smoot
(74) *Attorney, Agent, or Firm* — Oliff PLC

(57) ABSTRACT

A semiconductor device has a semiconductor substrate including a body region, a drift region, a trench that extends from a surface of the semiconductor substrate into the drift region through the body region, and a source region located adjacent to the trench in a range exposed to the surface of the semiconductor substrate, the source region being isolated from the drift region by the body region. A specific layer is disposed on a bottom of the trench, and it has a characteristic of forming a depletion layer at a junction between the specific layer and the drift region. An insulating layer covers an upper surface of the specific layer and a sidewall of the trench. A conductive portion is formed on a part of the side wall of the trench. The conductive portion is joined to the specific layer, and reaches the surface of the semiconductor substrate.

7 Claims, 15 Drawing Sheets

(51) Int. Cl.
*H01L 29/423* (2006.01)
*H01L 29/417* (2006.01)
*H01L 29/66* (2006.01)
*H01L 29/06* (2006.01)
*H01L 21/28* (2006.01)
*H01L 21/04* (2006.01)
*H01L 29/16* (2006.01)

(52) U.S. Cl.
CPC ... *H01L 29/66068* (2013.01); *H01L 29/66666* (2013.01); *H01L 29/7806* (2013.01); *H01L 29/7813* (2013.01); *H01L 29/7827* (2013.01); *H01L 21/047* (2013.01); *H01L 29/1608* (2013.01); *H01L 29/42368* (2013.01)

(56) References Cited

U.S. PATENT DOCUMENTS

2010/0224932 A1   9/2010   Takaya et al.
2012/0139037 A1*  6/2012   Lin et al. .................. 257/330

FOREIGN PATENT DOCUMENTS

| JP | A-2009-117593 | 5/2009 |
| JP | A-2009-170670 | 7/2009 |

* cited by examiner

F I G . 2
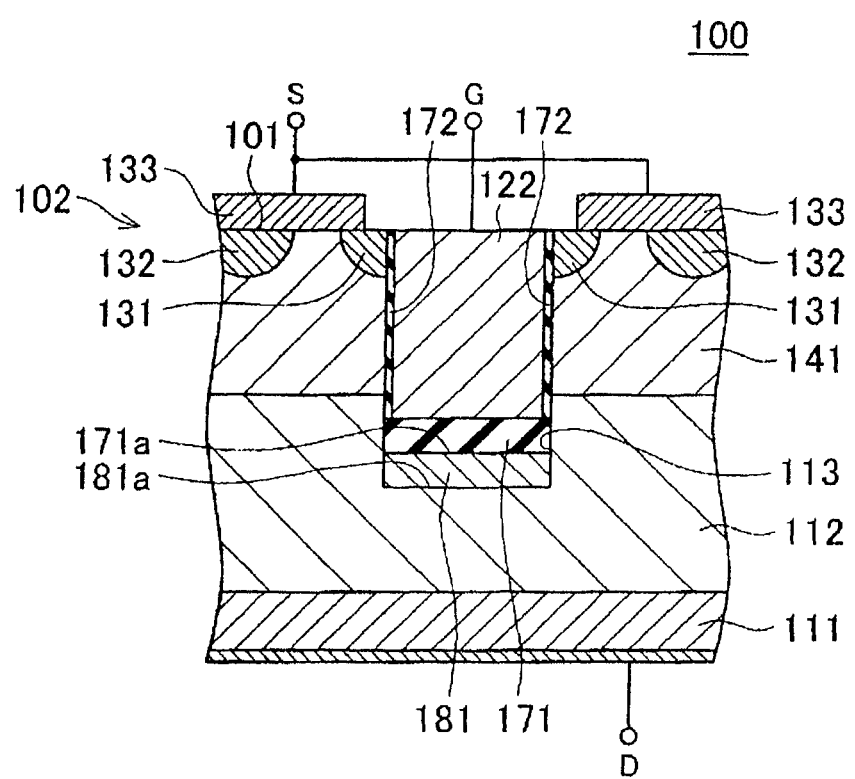

F I G . 7
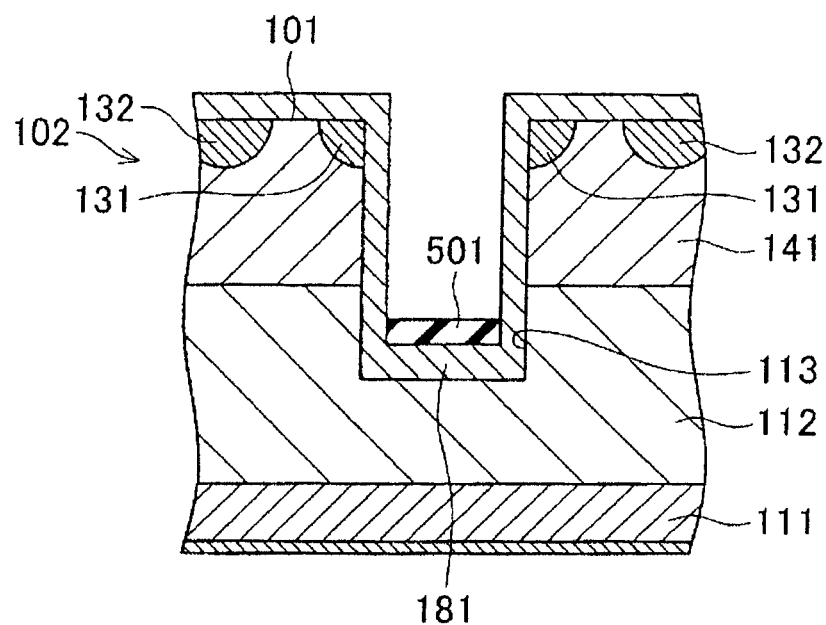
F I G . 8
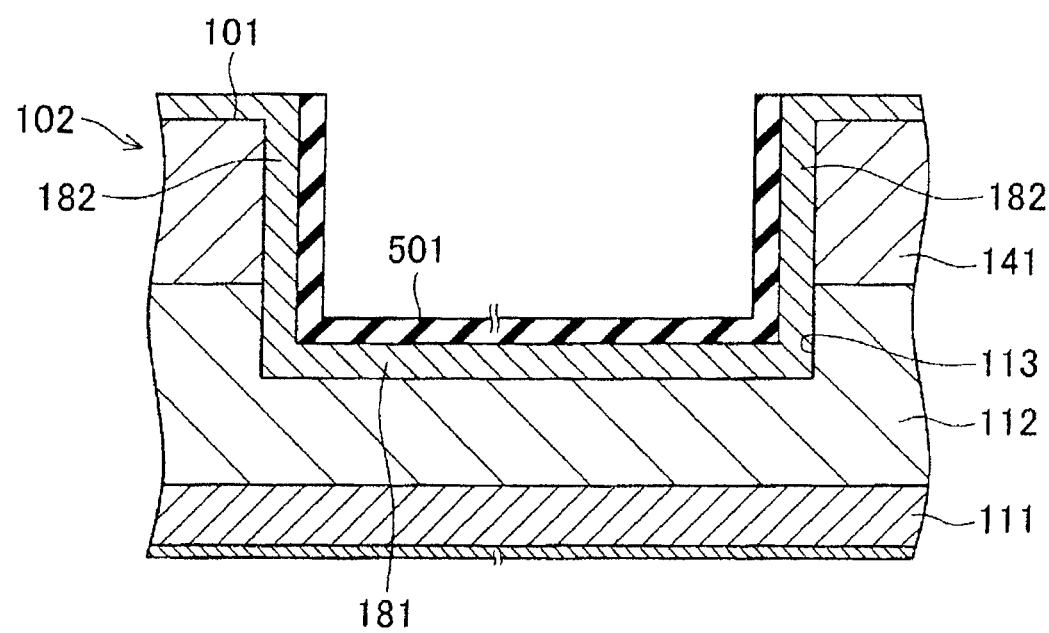

F I G . 9
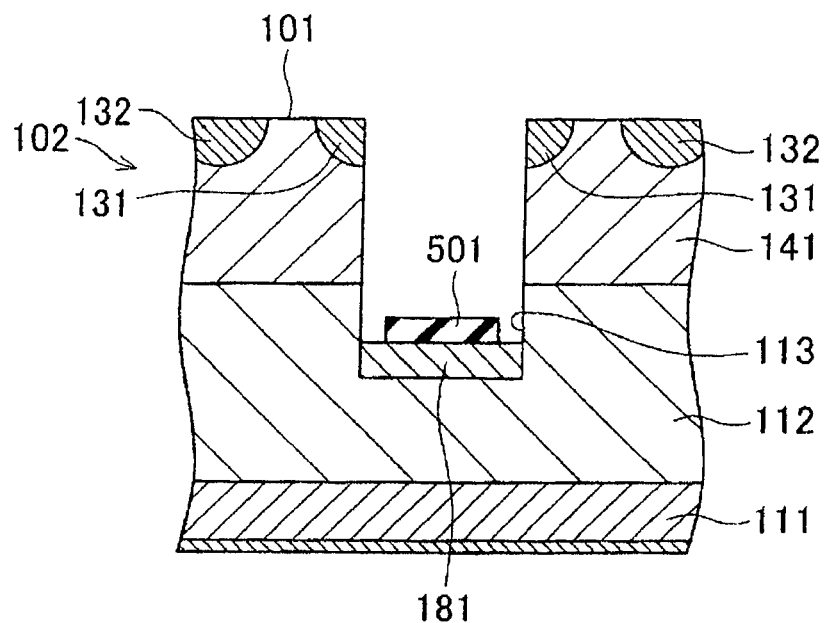
F I G . 10
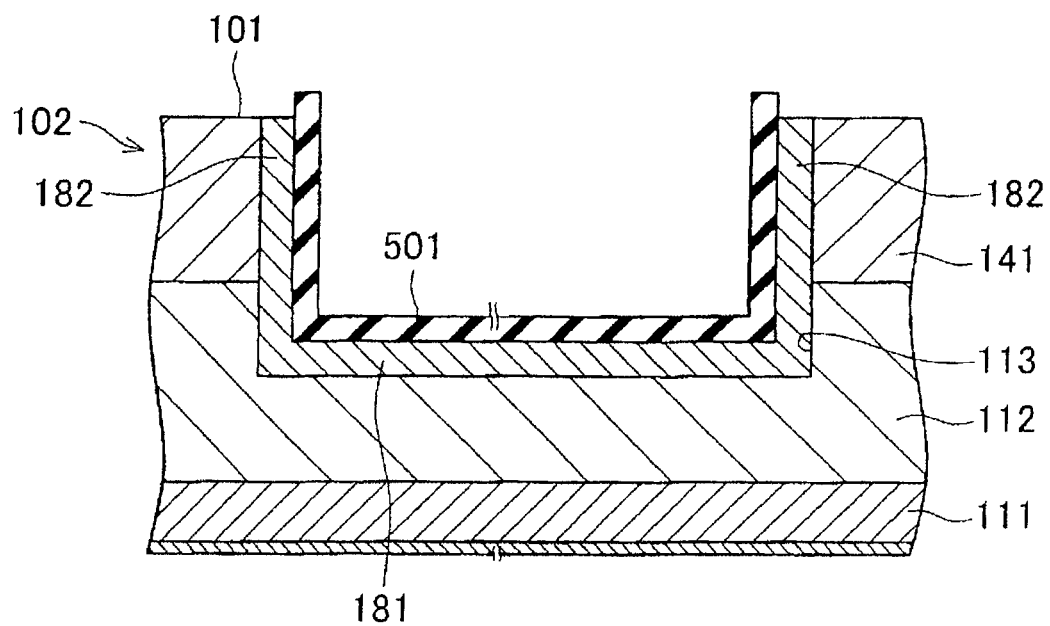

F I G . 19
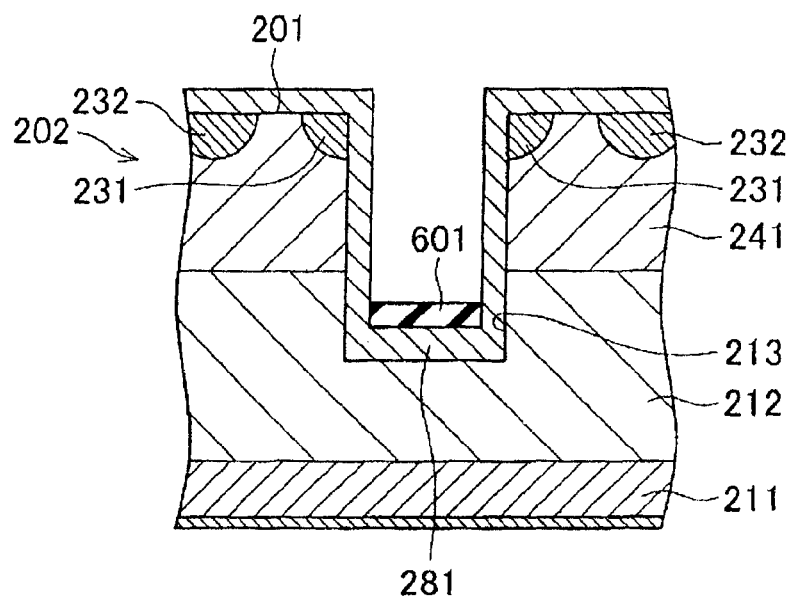
F I G . 20
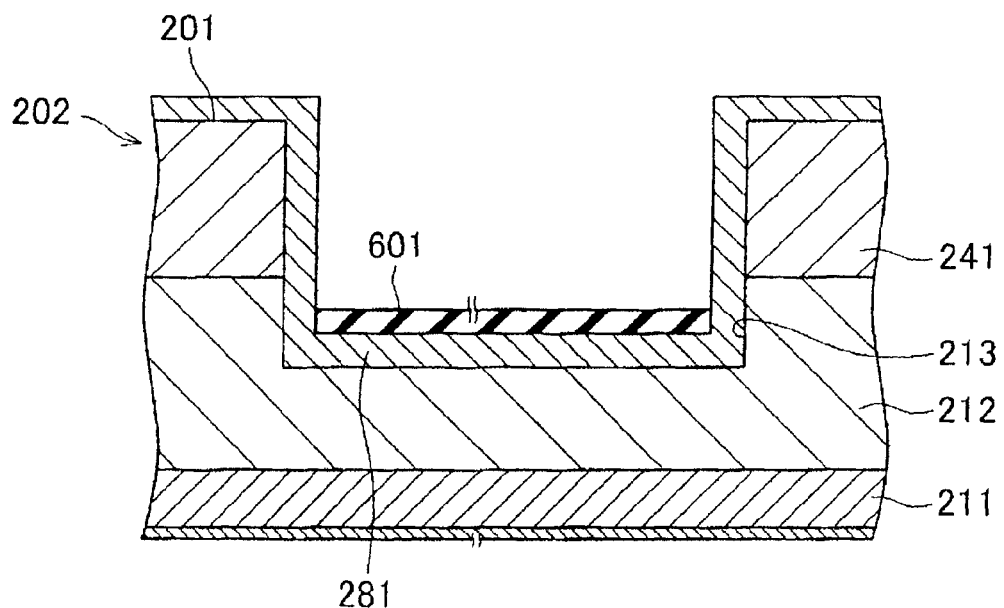

SEMICONDUCTOR DEVICE HAVING VERTICAL MOSFET STRUCTURE THAT UTILIZES A TRENCH-TYPE GATE ELECTRODE AND METHOD OF PRODUCING THE SAME

BACKGROUND OF THE INVENTION

1. Field of the Invention

The invention relates to a semiconductor device, and a method of producing the semiconductor device. Particularly, the invention is concerned with a technology of increasing the withstand voltage of a semiconductor device having a semiconductor structure (such as a MOSFET structure, IGBT structure or a diode structure) using a trench-type electrode.

2. Description of Related Art

A technology of constructing a semiconductor structure (such as MOSFET, IGBT, or diode) that functions as a semiconductor device, in a semiconductor substrate in which a body region of a first conductivity type (e.g., p-type) is laminated on a surface of a drift region of a second conductivity type (e.g., n-type), has been developed. In this type of semiconductor device, trench-type electrodes may be used. In this connection, there is known a technology of increasing the withstand voltage of the semiconductor device and suppressing or preventing breakdown of the semiconductor device, by increasing the thickness of an insulating film that fills a bottom portion of each trench, so as to relax an electric field in the bottom portion of the trench. The related art as described above is disclosed in, for example, Japanese Patent Application Publication No. 10-98188 (JP 10-98188 A).

However, in the semiconductor device of JP 10-98188 A, too, breakdown may occur when an electric field that is higher than an allowable electric field allowed to be applied to the thick insulating film in the bottom portion of the trench is applied to the insulating layer. In this case, carriers may flow into a gate electrode, through a gate oxide film of the trench-type electrode, and may affect the gate insulating film.

SUMMARY OF THE INVENTION

The invention provides a semiconductor device using a trench-type electrode, which is constructed so that the occurrence of breakdown has a reduced influence on a gate insulating film of the semiconductor device.

A semiconductor device according to a first aspect of the invention includes, a semiconductor substrate including a body region of a first conductivity type: a drift region of a second conductivity type having a surface on or above which the body region is laminated, a trench that extends from a surface of the semiconductor substrate into the drift region through the body region, and a source region of the second conductivity type located adjacent to the trench in a range exposed to the surface of the semiconductor substrate, the source region being isolated from the drift region by the body region; a source electrode electrically connected to the source region; a drain electrode formed on a rear surface of the semiconductor substrate; a specific layer that is disposed on a bottom of the trench, and has a characteristic of forming a depletion layer at a junction between the specific layer and the drift region; an insulating layer that covers an upper surface of the specific layer and a side wall of the trench; a gate electrode formed within the trench covered with the insulating layer; and a conductive portion formed on a part of the side wall of the trench in a depth direction of the semiconductor substrate, along the side wall of the trench, the conductive portion having a first end portion that is joined to the specific layer, and a second end portion that reaches the surface of the semiconductor substrate, the conductive portion being connected to the source electrode.

According to the first aspect of the invention, the specific layer is formed in a bottom portion of the trench. In operation, a depletion layer is formed at a junction between the specific layer and the drift region, and the specific layer connected to the source electrode via the conductive portion and the drift region function as a diode. The junction between the specific layer and the drift region is located at a lower level than an interface between the drift region and the body region. With this arrangement, an electric field at the bottom of the trench can be relaxed. Also, with this arrangement, when a high electric field is applied between the drain electrode and the source electrode, the junction between the specific layer and the drift region is designed to break down earlier than the insulating layer that covers the inner walls of the trench. Since carriers produced at the time of breakdown are controlled to escape from the specific layer to the source electrode, the insulating layer covering the inner walls of the trench is less likely or unlikely to be influenced by the breakdown.

Also, since the specific layer is designed to function as a diode, a diode-integrated-type semiconductor device can be produced. Namely, a semiconductor device in which a transistor and a diode are integrated in the direction of the depth of the semiconductor substrate can be produced. Accordingly, the chip area can be reduced as compared with a semiconductor device in which a transistor and a diode are integrated in the direction of the plane of the semiconductor substrate (i.e., a semiconductor device in which a transistor and a diode are formed in the same plane).

In the semiconductor device according to the first aspect of the invention, the specific layer may be a metal layer, and a Schottky junction may be formed at the junction between the specific layer and the drift region.

With the above arrangement, the specific layer and the drift region can function as a Schottky barrier diode. The use of the Schottky barrier diode leads to reduction of a voltage drop in the forward direction and increase of the switching speed, as compared with the case where a PN junction type diode is used.

In the semiconductor device according to the first aspect of the invention, the conductive portion may be the same metal layer as that of the specific layer.

With the above arrangement, the process of producing the semiconductor device can be simplified.

In the semiconductor device according to the first aspect of the invention, the conductive portion may be formed by a semiconductor region of the first conductivity type, and the first end portion of the conductive portion may be joined to the specific layer as the metal layer.

The first end portion of the first-conductivity-type conductive portion and the specific layer in the form of a metal layer are joined to each other, to form a Schottky junction. In this case, the direction in which electric current flows when the trench operates as a transistor is the reverse of the forward direction of the Schottky junction between the conductive portion and the specific layer. When a voltage is applied between the source electrode and the drain electrode so that a forward bias voltage is applied to the transistor, a reverse bias voltage is applied to the Schottky junction between the conductive portion and the specific layer. As a result, a depletion layer widens, and the specific layer and the source electrode are electrically disconnected from each other, so that the specific layer is brought into a floating condition. Thus, the Schottky junction between the specific layer and the drift region can be used as a withstand voltage supporting portion.

Also, when a voltage is applied between the source electrode and the drain electrode so that a reverse bias voltage is applied to the transistor, a forward bias voltage is applied to the Schottky junction between the conductive portion and the specific layer, so that the specific layer and the source electrode are electrically connected to each other. Thus, the specific layer and the drift region can function as a Schottky barrier diode.

In the semiconductor device according to the first aspect of the invention, the thickness of the insulating layer that covers the upper surface of the specific layer may be larger than that of the insulating layer that covers the side wall of the trench.

With the above arrangement, an electric field that appears in the bottom portion of the trench can be relaxed, so that the withstand voltage of the semiconductor device can be further increased.

In the semiconductor device according to the first aspect of the invention, the trench may be formed in a rectangular shape having long sides and short sides, when observed from the surface of the semiconductor substrate, and the conductive portion may be located adjacent to at least a part of the side wall of the trench located at each of the short sides thereof, while the source region may be located adjacent to at least a part of the side wall of the trench located at each of the long sides thereof.

With the above arrangement, the trench can function as a transistor, using the side wall of the trench located at each long side thereof, and the bottom portion of the trench can function as a diode, using the side wall of the trench located at each short side thereof. Thus, the semiconductor device in which the transistor and the diode are integrated in the direction of the depth of the semiconductor substrate can be prepared.

A method of producing the semiconductor device as described above according to a second aspect of the invention includes a trench forming step of forming at least one trench that extends from the surface of the semiconductor substrate in which the body region of the first conductivity type is laminated on the surface of the drift region of the second conductivity type, into the drift region, through the body region, a specific layer forming step of forming a specific layer on a bottom of the trench, a conductive portion forming step of forming a conductive portion on a side wall of the trench, a first insulating layer forming step of forming a first insulating layer on inner walls of the trench, a first etching step of etching the first insulating layer formed in the first insulating layer forming step, so that the lowest point of an upper surface of the first insulating layer formed in the first insulating layer forming step, within the trench, is located at a lower level than an interface between the drift region and the body region, and a second insulating layer forming step of forming a second insulating layer on the side wall of the trench.

According to the second aspect of the invention, the specific layer can be formed in a bottom portion of the trench. Also, the specific layer is electrically connected to the source electrode via the conductive portion, so that the specific layer and the drift region can function as a diode. The junction between the specific layer and the drift region can be formed so as to be located at a lower level than the interface between the drift region and the body region. With this arrangement, an electric field that appears in the bottom portion of the trench can be relaxed. Also, when a high electric field is applied between the drain electrode and the source electrode, the junction between the specific layer and the drift region is designed to break down earlier than the insulating layer that covers the inner walls of the trench, so that the insulating layer that covers the inner walls of the trench is less likely or unlikely to be influenced by the breakdown.

In the method according to the second aspect of the invention, the trench may be formed in a rectangular shape having long sides and short sides, when observed from the surface of the semiconductor substrate, in the trench forming step, and the conductive portion forming step may be the same step as the specific layer forming step, while a metal layer that provides the specific layer and the conductive portion may be formed on the inner walls of the trench in the specific layer forming step. A second etching step may be further provided for removing portions of the metal layer which cover side walls of the long sides of the trench, such that portions of the metal layer which cover side walls of the short sides of the trench remain.

In the above-described manner, the conductive portions that extend in the direction of the depth of the semiconductor substrate along the side walls (short sides) of the trench are formed from the same metal layer as used for the specific layer, on respective parts of the side walls of the trench. Also, the specific layer located in the bottom portion of the trench and the conductive portions located on parts of the side walls of the trench are integrally formed, so that the conductive portions and the specific layer can be securely joined together. Also, an additional or new step of producing the conductive portions need not be provided, so that the process of producing the semiconductor device can be simplified.

In the method according to the second aspect of the invention, the trench may be formed in a rectangular shape having long sides and short sides, when observed from the surface of the semiconductor substrate, in the trench forming step, and a metal layer that provides the specific layer may be formed in the specific layer forming step, while a second etching step may be further provided for removing portions of the metal layer which cover side walls of the short sides of the trench and side walls of the tong sides of the trench. The conductive portion forming step may be carried out between the second etching step and the first insulating layer forming step, and the conductive portion forming step may include an ion implanting step of implanting ions into each of the side walls of the short sides of the trench, at an angle inclined relative to a vertical upward direction of the semiconductor substrate, so that a semiconductor region of a first conductivity type that extends in a depth direction of the semiconductor substrate along the side wall of the trench is formed on a part of each of the side walls of the short sides of the trench.

In the above-described manner, the conductive portions that are located on parts of the side walls of the trench and extends in the direction of the depth of the semiconductor substrate along the side walls of the trench can be formed by the first-conductivity-type semiconductor regions. Thus, when a reverse bias voltage is applied to the Schottky junction between each conductive portion and the specific layer, the specific layer can be brought into a floating condition, and the Schottky junction between the specific layer and the drift region can be used as a withstand voltage supporting portion.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 2 is a cross-sectional view taken along line in FIG. 1;

FIG. 7 is a view (No. 4) showing the process of producing the semiconductor device according to the first embodiment of the invention;

FIG. 8 is a view (No. 5) showing the process of producing the semiconductor device according to the first embodiment of the invention;

FIG. 9 is a view (No. 6) showing the process of producing the semiconductor device according to the first embodiment of the invention;

FIG. 10 is a view (No. 7) showing the process of producing the semiconductor device according to the first embodiment of the invention;

FIG. 19 is a view (No. 1) showing a process of producing the semiconductor device according to the second embodiment of the invention;

FIG. 20 is a view (No. 2) showing the process of producing the semiconductor device according to the second embodiment of the invention;

DETAILED DESCRIPTION OF EMBODIMENTS

Main features of embodiments of the invention which will be described below will be listed. (Feature 1) A semiconductor structure formed in a cell area is a MOSFET structure.

Figure 1:
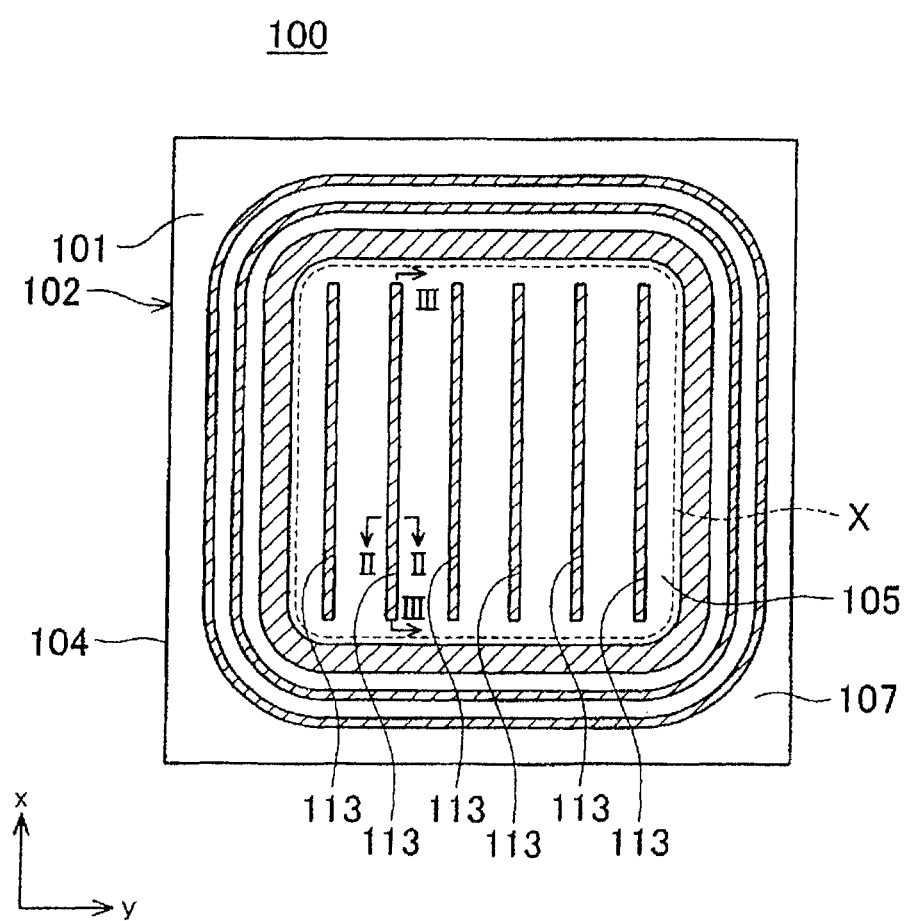
FIG. 1 is a plan view showing a semiconductor device according to a first embodiment of the invention.

A semiconductor device according to one embodiment of the present invention will be described in detail with reference to the drawings. As shown in FIG. 1, the semiconductor device 100 is produced using a semiconductor substrate 102 having an outer periphery 104. The semiconductor substrate 102 is divided into a cell area 105 (within a frame X indicated by a broken line in FIG. 1) in which the semiconductor structure that performs transistor actions is incorporated, and a terminal area 107 that surrounds the cell area 105. Six trenches 113 are formed in the cell area 105 so as to extend in the vertical direction in FIG. 1 (or x direction denoted in FIG. 1). The number of trenches 113 is not limited to six, but may be set to any number as desired.

Figure 3:
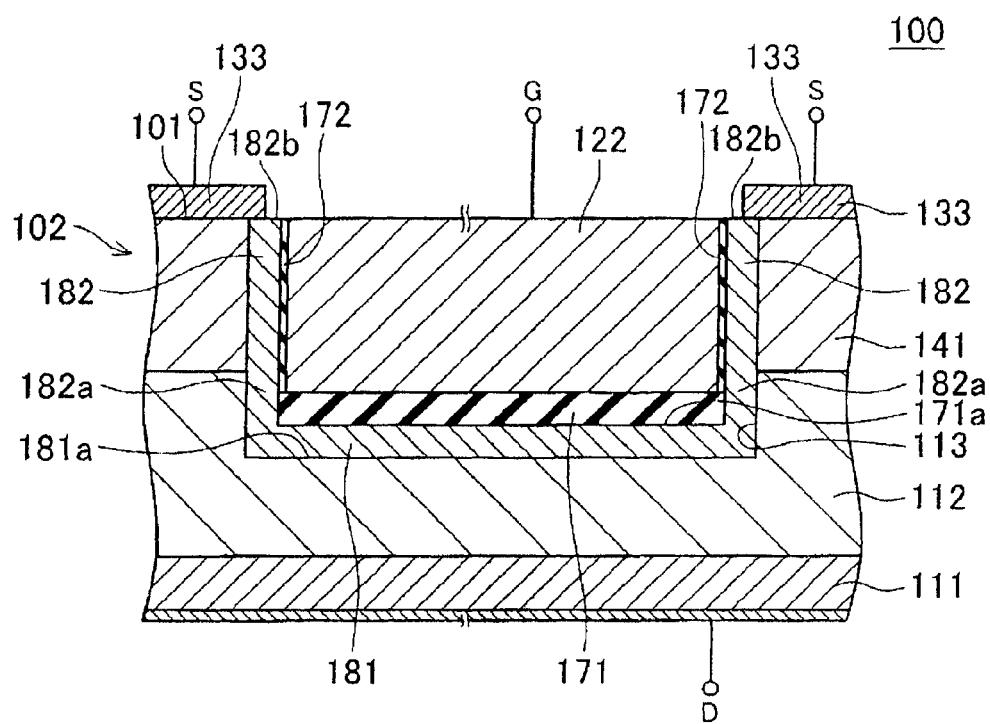
FIG. 3 is a cross-sectional view taken along line in FIG. 1.

Referring to FIG. 2 and FIG. 3, the internal structure of the semiconductor device 100 will be described. The semiconductor device 100 uses silicon carbide (SiC). As shown in FIG. 2, the semiconductor substrate 102 is formed by laminating an n+ drain region 111, n− drift region 112, and a p− body region 141 in the order of description, as viewed in a direction from the rear surface to the surface (top face) of the substrate 102 (from the lower side to the upper side in FIG. 2). Since SiC has a smaller impurity diffusion coefficient than Si, it is difficult to form the body region 141 by impurity diffusion. In this embodiment, the body region 141 is formed by epitaxial growth.

Each of the trenches 113 extends from the surface 101 of the semiconductor substrate 102 into the drift region 112, through the body region 141. When observed from the surface of the semiconductor substrate 102, the trench 113 is formed in a rectangular shape having long sides and short sides. The bottom of the trench 113 is covered with a specific layer 181. Side walls of the trench 113 located at the short sides thereof are covered with electrically conductive portions 182. Source regions 131 are formed adjacent to at least parts of side walls of the trench 113 located at the long sides. The specific layer 181 and the conductive portions 182 are integrally formed from the same metal layer (titanium (Ti) layer), The thickness of the specific layer 181 (as measured in a direction perpendicular to the bottom of the trench 113) is substantially equal to the thickness of the conductive portions 182 (as measured in a direction perpendicular to the side walls of the trench 113).

An oxide film 171 is formed on a surface of the specific layer 181. A gate oxide film 172 is formed on surfaces of the conductive portions 182. The gate oxide film 172 is also formed on the side walls of the trench 113 located at the long sides thereof, as shown in FIG. 2. The specific layer 181 is in contact with a bottom surface 171a of the oxide film 171. A bottom surface 181a of the specific layer 181 is in contact with the drift region 112. Each of the conductive portions 182 contacts at its side faces with the gate oxide film 172, the drift region 112 and the body region 141. The conductive portion 182 has a first end portion 182a as a lower end portion, which is joined to the specific layer 181. The conductive portion 182 has a second end portion 182b as an upper end portion, which is exposed to the surface of the semiconductor substrate 102. The bottom surface 171a of the oxide film 171 is located at a lower level than an interface between the drift region 112 and the body region 141. The gate oxide film 172 extends down to a lower level than the interface between the drift region 112 and the body region 141. The thickness of the oxide film 171 (as measured in a direction perpendicular to the bottom of the trench 113) is larger than the thickness of the gate oxide film 172 (as measured in a direction perpendicular to the side walls of the trench 113).

A gate electrode 122 is embedded in the trench 113, such that the gate electrode 122 is insulated from the semiconductor substrate 102, specific layer 181 and the conductive portions 182, by the gate oxide film 172 and the oxide film 171, For example, the gate electrode 122 is formed of polysilicon. The gate electrode 122 extends from the surface of the body region 141 into the drift region 112, through the body region 141. In other words, the bottom surface of the gate electrode 122 is located at a lower level than the interface between the drift region 112 and the body region 141.

As shown in FIG. 2, n+ source regions 131 are formed in the surface 101 of the semiconductor substrate 102 at positions adjacent to the trench 113. Also, p+ body contact regions 132 are formed in the vicinity of the source regions 131. A source electrode 133 is formed on the surfaces of the source regions 131 and body contact regions 132. The source electrode 133 is connected to a source wiring S. Also, the source electrode 133 is connected to a part of the surface of the second end portion 182b of each conductive portion 182.

The gate electrode 122 is connected to a gate wiring G. A gate voltage is applied to the gate electrode 122. The gate electrode 122 is insulated from the source electrode 133 and the source wiring S. The gate voltage is used for controlling flow of electric current in the cell area 105. The n+ drain region 111 is connected to a drain wiring D. The drain wiring D is connected to a positive potential, and the source wiring S is grounded. In the cell area 105, a vertical power MOSFET transistor structure is formed by the source region 131, body region 141, drift region 112, drain region 111 and the gate electrode 122.

The operation of the semiconductor device 100 will be described. The semiconductor device 100 is used in a condition where the source wiring S is grounded and kept at the ground (GND) potential, and a positive voltage is applied to the drain wiring D. If a positive voltage is applied to the gate electrode 122, an inversion layer that provides a channel is formed in a region of the body region 141 which faces the gate electrode 122, thus achieving electrical conduction between the source region 131 and the drain region 111. If no positive voltage is applied to the gate electrode 122, no current flows between the source region 131 and the drain region 111. Thus, the semiconductor device 100 performs transistor actions.

Effects of the semiconductor device 100 according to this embodiment will be described. In the semiconductor device 100 of this embodiment shown in FIG. 2, the specific layer 181 is formed on the bottom of the trench 113. Since the specific layer 181 forms a depletion layer at a junction with the drift region 112, and the specific layer 181 is connected to the source electrode 133 via the conductive portions 182, the specific layer 181 and the drift region 112 function as a diode. The junction between the specific layer 181 and the drift region 112 is located at a lower level than the interface between the drift region 112 and the body region 141. This arrangement makes it possible to relax an electric field at the bottom of the trench 113. Also, when a high electric field is applied between the drain electrode and the source electrode, the junction between the specific layer 181 and the drift region 112 is adapted to break down, earlier than the oxide film 171 and gate oxide film 172 with which the inner walls of the trench 113 are covered. Further, carriers produced at the time of breakdown are adapted to escape to the source electrode 133 via the specific layer 181 and the conductive portions 182, so that the gate oxide film 172 is less likely or unlikely to be influenced by the high electric field.

Since the specific layer 181 is able to function as a part of the diode, the semiconductor device 100 can be created as a diode-integrated semiconductor device. Namely, the semiconductor device 100 in which a transistor and a diode are integrated in the direction of the depth of the semiconductor substrate 102 can be created. Accordingly, the chip area can be reduced, as compared with a semiconductor device in which a transistor and a diode are integrated in the direction of plane of the semiconductor substrate (i.e., a semiconductor device in which the transistor and the diode are formed in the same plane).

Also, the specific layer 181 is a metal layer, and a Schottky junction is formed at the junction between the specific-layer 181 and the drift region 112; therefore, the specific layer 181 and the drift region 112 are able to function as a Schottky barrier diode. By using the Schottky barrier diode, a voltage drop in the forward direction can be reduced, and the switching speed can be increased, as compared with the case where a diode having a PN junction is used.

Since the thickness of the oxide film 171 that covers the upper surface of the specific layer 181 is larger than the thickness of the gate oxide film 172 that covers the side walls of the trench 113, an electric field at the bottom of the trench 113 can be relaxed. As a result, the withstand voltage of the semiconductor device can be further increased.

When observed from the surface of the semiconductor substrate 102, the trench 113 is formed in a rectangular shape having long sides and short sides. The conductive portions 182 are located adjacent to at least parts of the side walls of the trench 113 located at the short sides, and the source regions 131 are located adjacent to at least parts of the side walls of the trench 113 located at the long sides. With this arrangement, it is possible to cause the trench 113 to function as a transistor, by using the side walls of the trench 113 located at the long sides thereof, and cause the bottom of the trench 113 to function as a diode, by using the side walls of the trench 113 located at the short sides thereof. Thus, it is possible to create a semiconductor device in which the transistor and the diode are integrated in the direction of the thickness of the semiconductor substrate 102.

Figure 4:
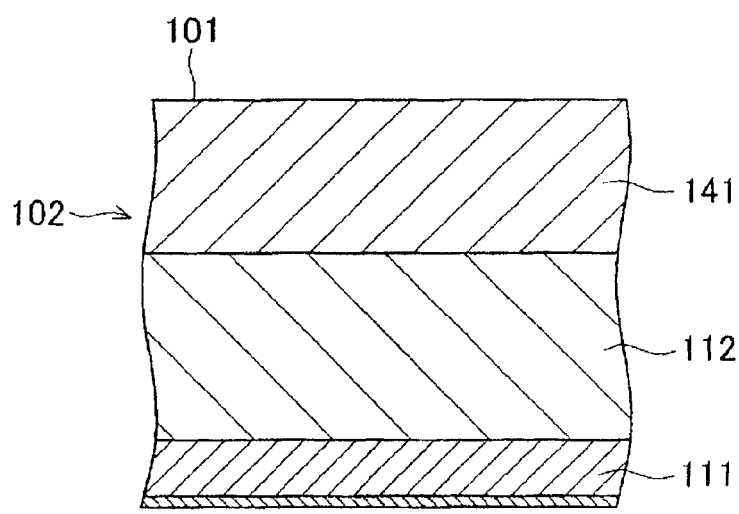
FIG. 4 is a view (No. 1) showing a process of producing the semiconductor device according to the first embodiment of the invention.

Next, the process of producing the semiconductor device 100 will be described with reference to FIG. 4 through FIG. 16. FIGS. 4, 5, 7, 9, 11, 13 and 15 are cross-sectional views each taken along line in FIG. 1. FIGS. 6, 8, 10, 12, 14 and 16 are cross-sectional views each taken along line in FIG. 1. Initially, the body region 141 is formed by epitaxial growth on the drift region 112. As a result, the semiconductor substrate 102 having the body region 141 in the form of an epitaxial layer on the drift region 112, as shown in FIG. 4, is prepared.

Figure 5:
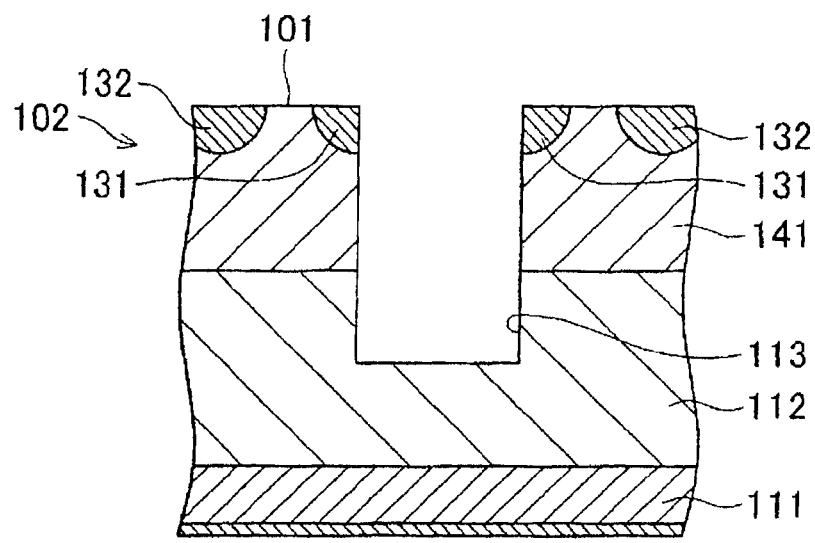
FIG. 5 is a view (No. 2) showing the process of producing the semiconductor device according to the first embodiment of the invention.
Figure 6:
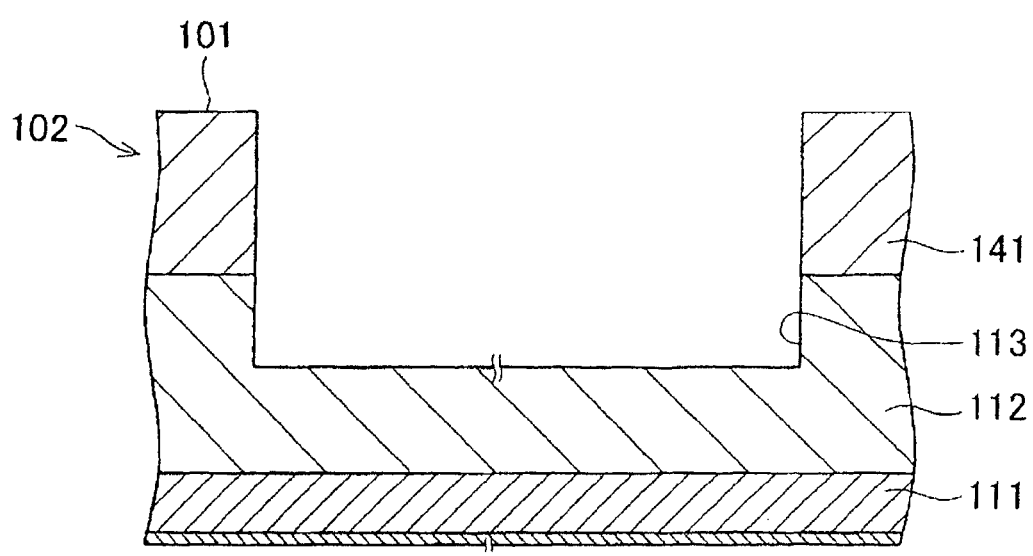
FIG. 6 is a view (No. 3) showing the process of producing the semiconductor device according to the first embodiment of the invention.

Next, the source regions 131 and the body contact regions 132 are formed in the semiconductor substrate 102. Then, an oxide film layer (not shown) is formed by the CVD (Chemical Vapor Deposition) method on the surface 101 of the semiconductor substrate 102, and a resist layer (not shown) is formed on the upper surface of the oxide film layer. Then, an opening (not shown) corresponding to the trench 113 is formed in the oxide film layer, using a photo-etching technology. The photo-etching technology means a series of treatments from photolithography to etching, such as RIE (Reactive Ion Etching). The photo-etching technology will not be described in detail since known methods can be used. Next, dry-etching is performed on the body region 141 and the drift region 112, using the oxide film layer as a mask (trench forming step). In this manner, the trench 113, which extends from the surface 101 of the semiconductor substrate into the drift region 112 through the body region 141, is formed, as shown in FIG. 5 and FIG. 6. The trench 113 is formed in a rectangular shape having long sides and short sides, when observed from the surface of the semiconductor substrate 102.

Next, as shown in FIG. 7 and FIG. 8, a Ti layer, which provides the specific layer 181 and the conductive portions 182, is formed by vapor deposition, sputtering, or plating, over the entire area of the surface 101 of the semiconductor substrate 102 (specific layer forming step and conductive portion forming step). In this manner, the specific layer 181 is formed on the bottom of the trench 113, and the conductive portions 182 are formed on the side walls of the trench 113. Then, a mask 501 for etching is formed on the surfaces of the specific layer 181 and the conductive portions 182, as shown in FIG. 7 and FIG. 8. The mask 501 is formed on the surface of the Ti layer formed on the bottom of the trench 113 and the side walls located at the short sides of the trench 113. The mask 501 is not formed on portions of the Ti layer which are formed on the side walls located at the long sides of the trench 113. When a silicon oxide film, or the like, is used as the mask 501, the mask 501 can be patterned by photo-etching, using a resist, for example. When a resist is used as the mask 501, the mask 501 can be patterned by photo-etching.

Next, etching of the Ti layer is carried out (second etching step). The etching conducted in this step is isotropic etching (wet etching). As a result, portions of the Ti layer which are not covered with the mask 501 are removed, and only portions of the Ti layer which provide the specific layer 181 and the conductive portions 182 remain, as shown in FIG. 9 and FIG. 10. The thickness of the specific layer 181 is substantially equal to the thickness of the conductive portions 182, and the specific layer 181 and the conductive portions 182 are integrally formed from the same Ti layer.

Figure 11:
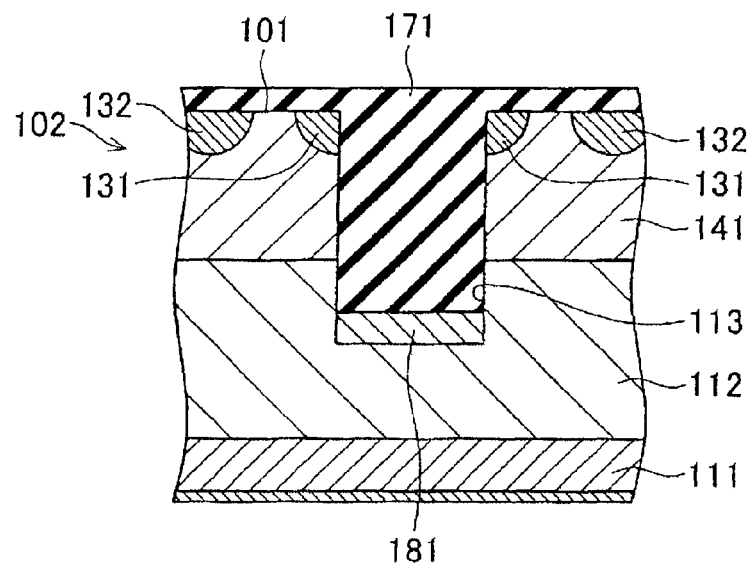
FIG. 11 is a view (No. 8) showing the process of producing the semiconductor device according to the first embodiment of the invention.
Figure 12:
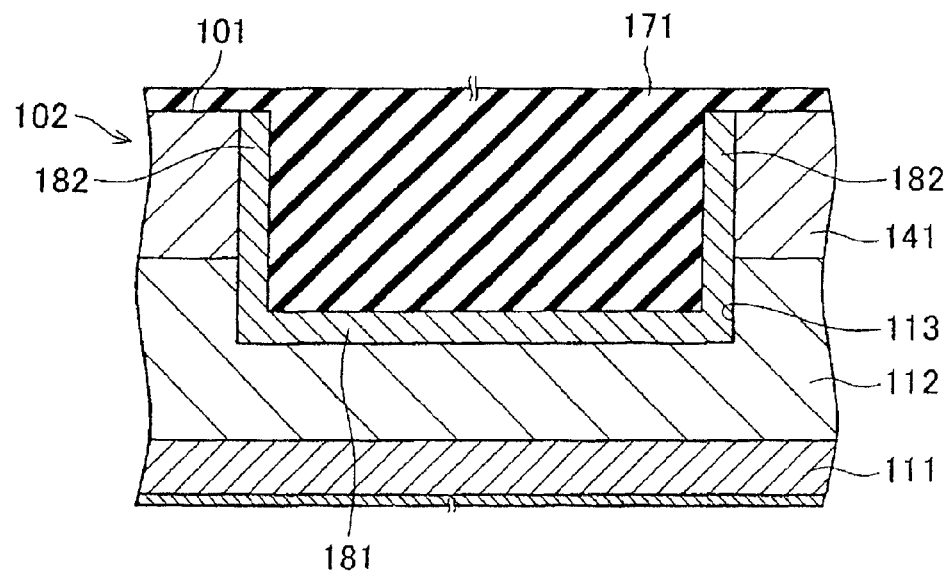
FIG. 12 is a view (No. 9) showing the process of producing the semiconductor device according to the first embodiment of the invention.

After the mask 501 is removed, the oxide film 171 is deposited over the entire area of the surface 101 of the semiconductor substrate 102 by the CVD method, as shown in FIG. 11 and FIG. 12 (first insulating layer forming step). As a result, the oxide film 171 is embedded in the trench 113. The oxide film 171 may be formed of a material, such as TEOS (Tetra Ethyl Ortho Silicate), BPSG (Boron Phosphor Silicate Glass), or SOG (Spin on Glass).

Figure 13:
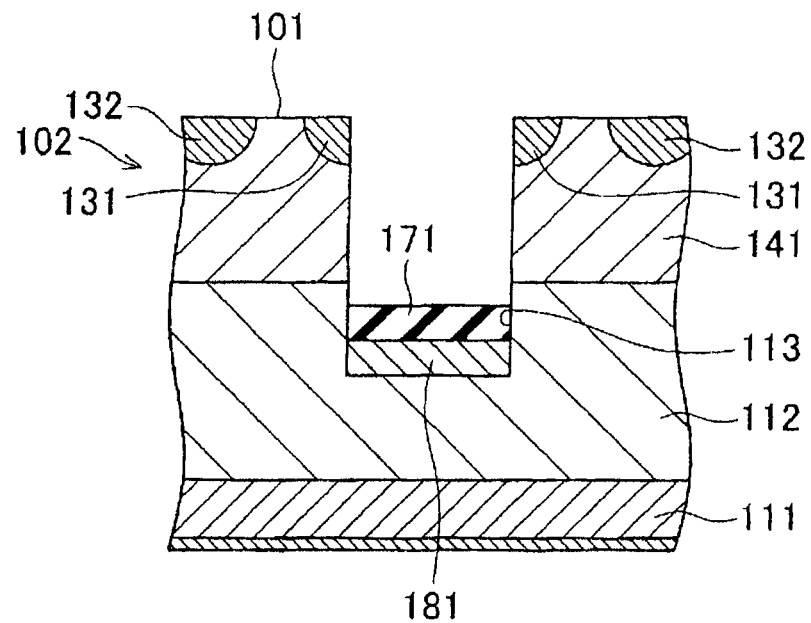
FIG. 13 is a view (No. 10) showing the process of producing the semiconductor device according to the first embodiment of the invention.
Figure 14:
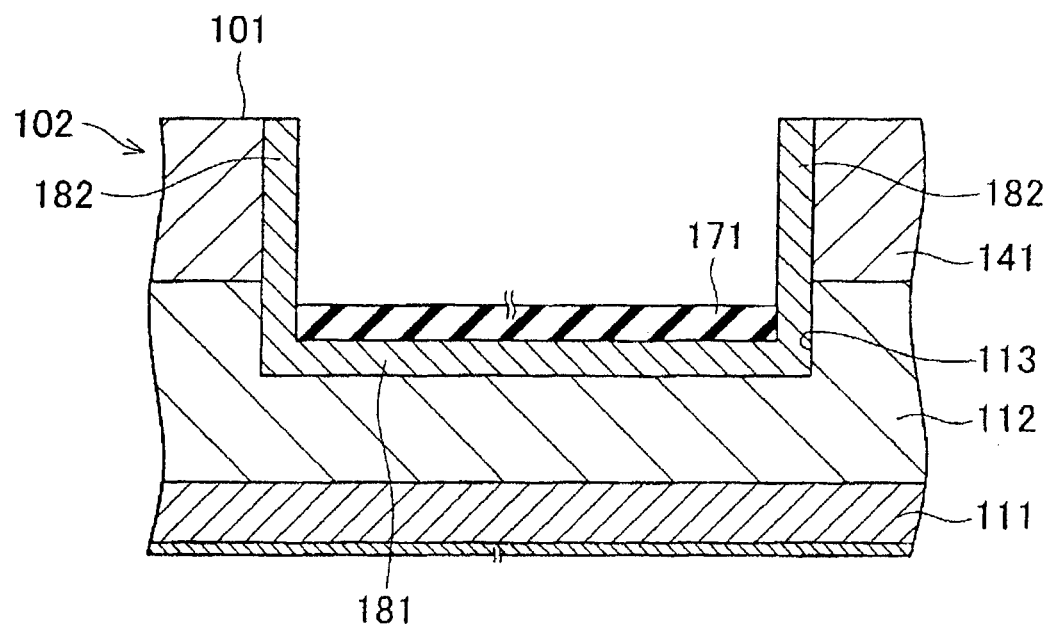
FIG. 14 is a view (No. 11) showing the process of producing the semiconductor device according to the first embodiment of the invention.

Next, etching of the oxide film 171 is carried out (first etching step), as shown in FIG. 13 and FIG. 14. The etching conducted in this step is anisotropic etching (RIE). As a result, the surface of the body region 141 in the cell area 105 is exposed. Also, the height of the oxide film 171 filled in the trench 113 is adjusted. The height is adjusted so that the upper surface of the oxide film 171 in the trench 113 is located at a lower level (in FIG. 13 and FIG. 14) than the interface between the drift region 112 and the body region 141.

Figure 15:
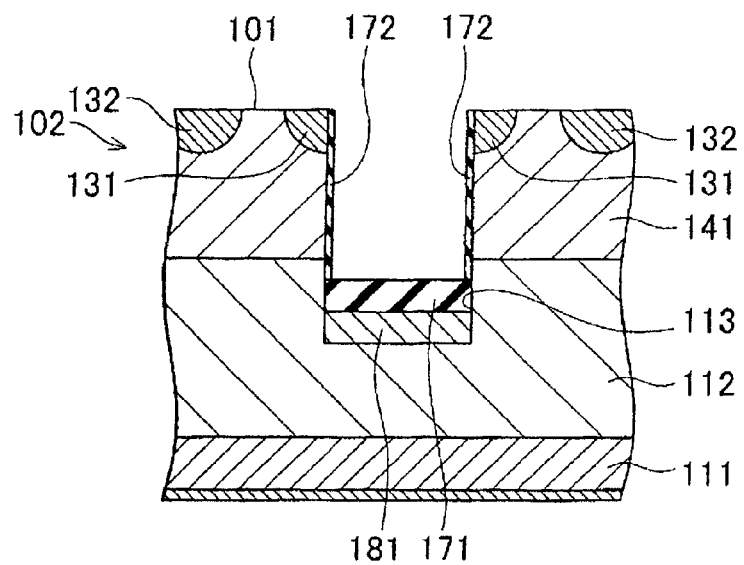
FIG. 15 is a view (No. 12) showing the process of producing the semiconductor device according to the first embodiment of the invention.
Figure 16:
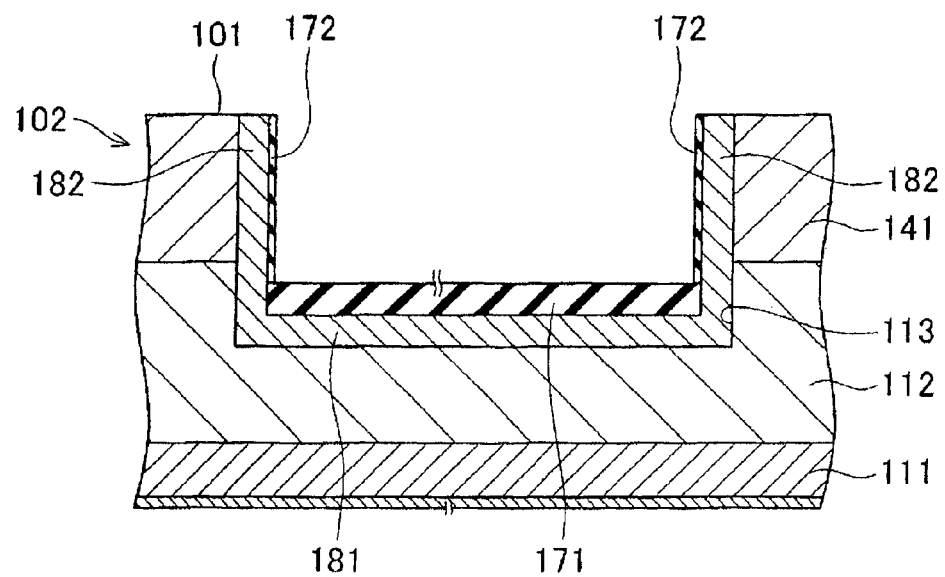
FIG. 16 is a view (No. 13) showing the process of producing the semiconductor device according to the first embodiment of the invention.

Next, the gate oxide film 172 is formed by thermal oxidation on side walls of the trench 113 (second insulating layer forming step), as shown in FIG. 15 and FIG. 16. The gate oxide film 172 may also formed from a CVD film, or the like. Next, polysilicon is deposited on the surface of the semiconductor substrate 102. Then, polysilicon is removed from portions other than the trench 113, by photo-etching. With the trench 113 thus filled with polysilicon, the gate electrode 122 is formed. Finally, the source electrode and the drain electrode are formed, so that the semiconductor device 100 as shown in FIG. 1 through FIG. 3 is completed.

Effects obtained from the process of producing the semiconductor device 100 of this embodiment will be described. According to the production process as described above, the specific layer 181 is formed on the bottom of the trench 113 and the conductive portions 182 are formed on parts of the side walls of the trench 113. Then, the specific layer 181 and the conductive portions 182 can be joined together at the first end portions 182a. The second end portions 182b of the conductive portions 182 are exposed to the surface of the semiconductor substrate 102, so that the conductive portions 182 can be electrically connected to the source electrode 133. With this arrangement, the specific layer 181 and the source electrode 133 are electrically connected to each other, and the specific layer 181 and the drift region 112 are able to function as a diode. Also, the junction between the specific layer 181 and the drift region 112 is formed so as to be located at a lower level than the interface between the drift region 112 and the body region 141.

In the trench forming step, the trench 113 is formed in the rectangular shape having the long sides and the short sides, when observed from the surface of the semiconductor substrate 102. Then, the conductive portion forming step and the specific layer forming step are carried out as the same step, and the Ti layer, which provides the specific layer 181 and the conductive portions 182, is formed on the inner walls of the trench 113 in the specific layer forming step. Then, in the first etching step, portions of the Ti layer (the conductive portions 182) which cover the side walls of the trench 113 located at the short sides are left unetched and remain, and portions of the Ti layer which cover the side walls of the trench 113 located at the long sides are removed.

In the above manner, the conductive portions 182 that extend in the direction of the depth of the semiconductor substrate 102 along the side walls of the trench 113 can be formed on parts of the side walls of the trench 113, from the same metal layer as the specific layer 181. Also, the specific layer 181 located on the bottom of the trench 113 can be formed integrally with the conductive portions 182 located on parts of the side walls of the trench 113. Therefore, the conductive portions 182 and the specific layer 181 can be securely joined together. Also, an additional or new step of preparing the conductive portions 182 can be omitted; therefore, the process of producing the semiconductor device 100 can be simplified.

Figure 17:
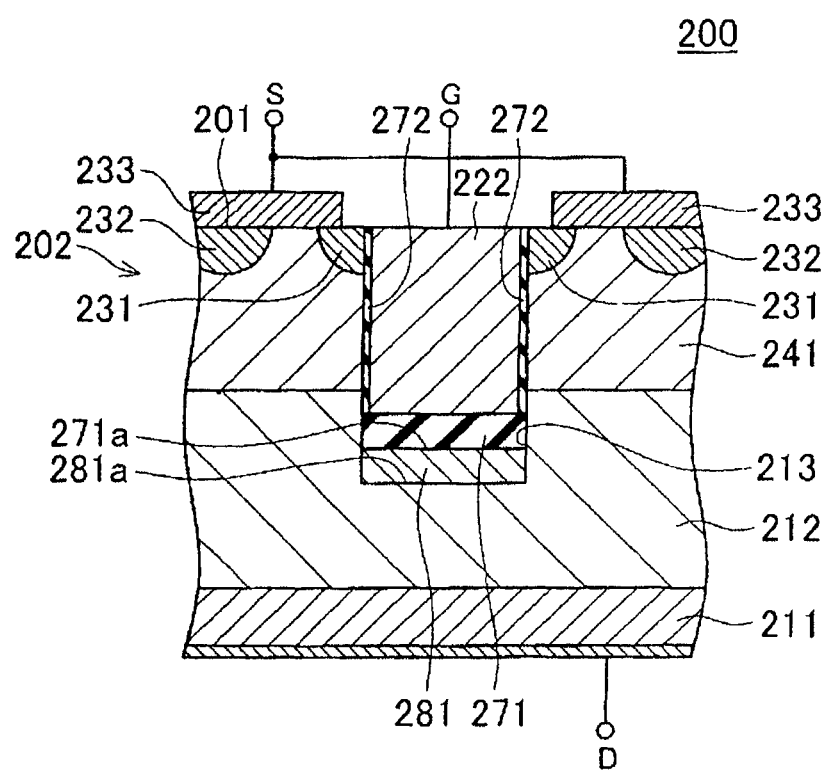
FIG. 17 is a cross-sectional view showing a semiconductor device according to a second embodiment of the invention.
Figure 18:
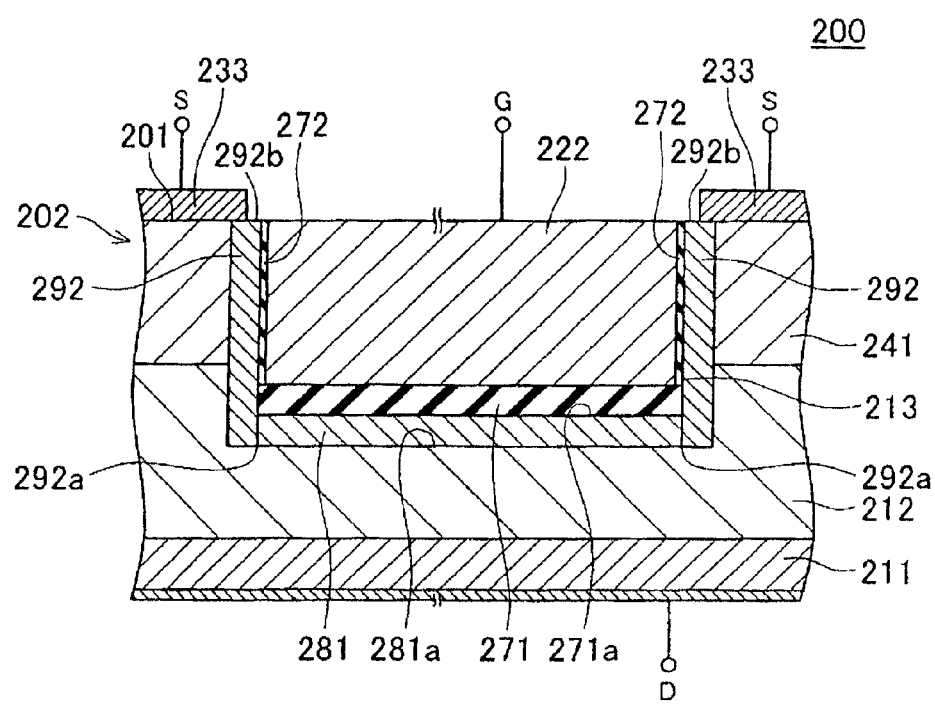
FIG. 18 is a cross-sectional view showing the semiconductor device according to the second embodiment of the invention.

A second embodiment of the invention is concerned with a semiconductor device 200 having conductive portions 292 in the form of p-type semiconductor regions formed integrally on the semiconductor substrate. Referring to FIG. 17 and FIG. 18, the internal structure of the semiconductor device 200 will be described. FIG. 17 and FIG. 18 are cross-sectional views corresponding to FIG. 2 and FIG. 3, respectively, of the first embodiment. As shown in FIG. 18, each of the conductive portions 292 contacts at its side faces with an oxide film 272, a drift region 212, and a body region 241. A first end portion 292a as a lower end portion of the conductive portion 292 is connected to a specific layer 281. A second end portion 292b as an upper end portion of the conductive portion 292 is exposed to the surface of the semiconductor substrate 202. A source electrode 233 is connected to a part of the surface of the second end portion 292b of the conductive portion 292. The other arrangement or construction of the semiconductor device 200 is substantially identical with that of the semiconductor device 100; therefore, other components to which reference numerals that are larger by 100 than those used in FIG. 1 through FIG. 3 are assigned will not be repeatedly explained. Also, the operation of the semiconductor device 200 is substantially the same as that of the semiconductor device 100 of the first embodiment, and therefore will not be described in detail.

Effects of the semiconductor device of this embodiment will be described. In the semiconductor device 200, the conductive portions 292 are formed as p-type semiconductor regions, and the first end portions 292a of the conductive portions 292 are joined to the specific layer 281 in the form of a Ti layer. Therefore, Schottky junctions are formed between the conductive portions 292 and the specific layer 281. The direction in which electric current flows when the trench 213 operates as a transistor is the reverse of the forward direction of the Schottky junction between the conductive portion 292 and the specific layer 281. Thus, when a voltage is applied between the source electrode and the drain electrode so that a forward bias voltage is applied to the transistor, a reverse bias voltage is applied to the Schottky junction between the conductive portion 292 and the specific layer 281. Therefore, a depletion layer widens so that the specific layer 281 and the source electrode 233 are electrically disconnected from each other, and the specific layer 281 is brought into a floating condition. As a result, a Schottky junction between the specific layer 281 and the drift region 212 can be used as a withstand voltage supporting portion. Also, when a voltage is applied between the source electrode and the drain electrode so that a reverse bias voltage is applied to the transistor, a forward bias voltage is applied to the Schottky junction between the conductive portion 292 and the specific layer 281. Therefore, the specific layer 281 and the source electrode 233 are electrically connected to each other. Thus, the specific layer 281 and the drift region 212 can function as a Schottky barrier diode.

Figure 21:
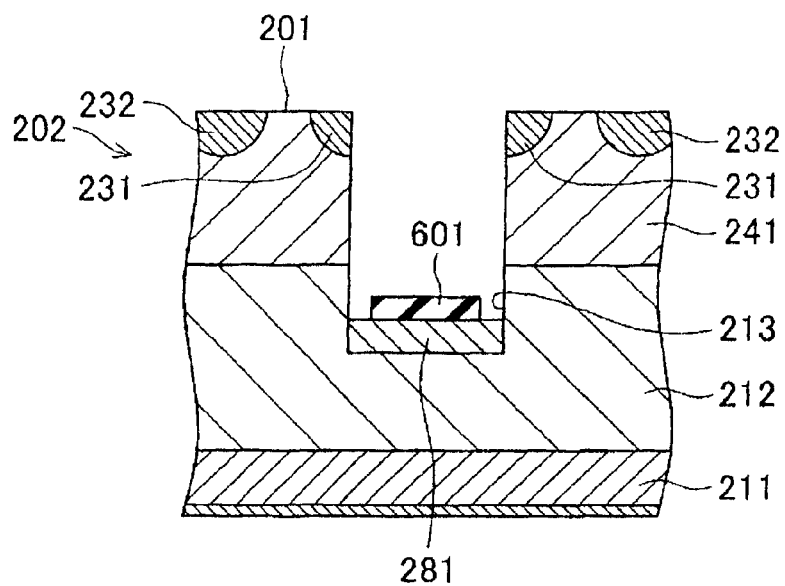
FIG. 21 is a view (No. 3) showing the process of producing the semiconductor device according to the second embodiment of the invention.

Next, the process of producing the semiconductor device 200 will be described with reference to FIG. 19 through FIG. 24. FIG. 19 and FIG. 21 are cross-sectional views showing the same cross-section as that of FIG. 17. FIG. 20 and FIG. 22 through FIG. 24 are cross-sectional views showing the same cross-section as that of FIG. 18. In the process of producing the semiconductor device 200, steps including and preceding the specific layer forming step, and steps including and following the first insulating layer forming step are substantially the same as those of the process of producing the semiconductor device 100 as described above in the first embodiment, and therefore, will not be described in detail.

After the Ti layer that provides the specific layer 281 is formed in the specific layer forming step, a mask 601 for etching is formed on the surface of the specific layer 281, as shown in FIG. 19 and FIG. 20. The mask 601 is formed on the surface of the Ti layer formed on the bottom of the trench 213. The mask 601 is not formed on surfaces of portions of the Ti layer which are formed on the side walls of the trench 213. The mask 601 may be patterned in substantially the same manner as that of the first embodiment.

Figure 22:
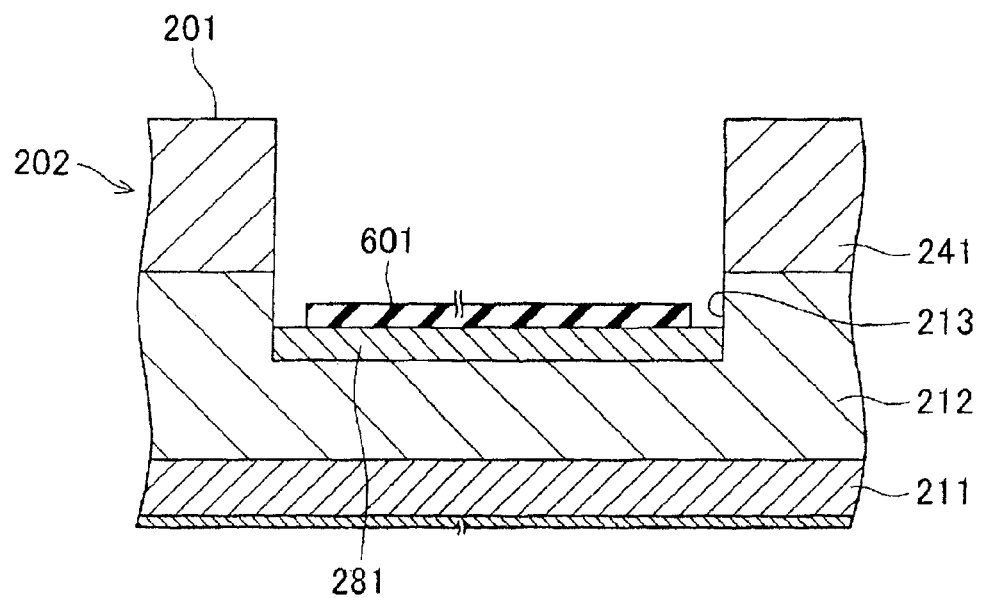
FIG. 22 is a view (No. 4) showing the process of producing the semiconductor device according to the second embodiment of the invention.

Next, etching of the Ti layer is carried out (second etching step). The etching conducted in this step is isotropic etching (wet etching). As a result, the portions of the Ti layer which are not covered with the mask 601 are removed, and only a portion of the Ti layer which provides the specific layer 281 remains, as shown in FIG. 21 and FIG. 22.

Figure 23:
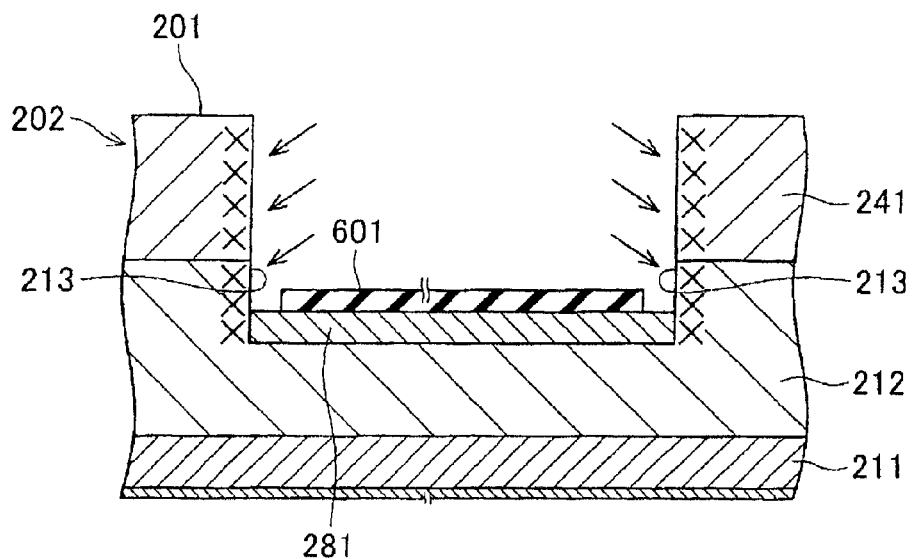
FIG. 23 is a view (No. 5) showing the process of producing the semiconductor device according to the second embodiment of the invention.

Next, a conductive portion forming step is carried out. Initially, ions are implanted into side walls of the trench 213 located at the short sides, at an angle inclined relative to the vertical, upward direction of the semiconductor substrate, as shown in FIG. 23 (ion implanting step). Since the mask 601 is formed on the bottom wall of the trench 113, ions are prevented from being implanted into the bottom wall of the trench 113. Thus, ions that form p-type semiconductor regions along the side walls of the trench 213 can be injected into the side walls of the trench 213 located at the short sides.

Figure 24:
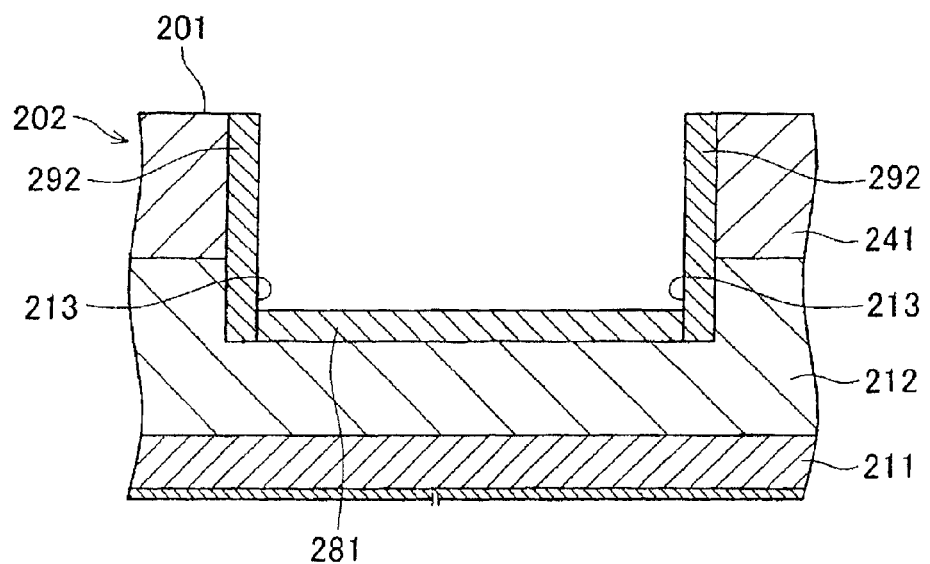
FIG. 24 is a view (No. 6) showing the process of producing the semiconductor device according to the second embodiment of the invention.

Next, as shown in FIG. 24, an annealing treatment is conducted, so that the injected ions are activated (activating step). As a result, the p-type semiconductor regions (which provides the conductive portions 292) extending in the direction of the depth of the semiconductor substrate along the side walls of the trench 213 can be formed on respective parts of the side walls of the trench 213 located at the short sides.

Thereafter, the first insulating layer forming step and other steps similar to those of the first embodiment are carried out, so that the semiconductor device 200 as shown in FIG. 17 and FIG. 18 is completed.

Effects obtained from the process of producing the semiconductor device 200 of this embodiment will be described. According to the process of producing the semiconductor device 200, the trench 213 is formed in the rectangular shape having the long sides and the short sides, when observed from the surface of the semiconductor substrate, in the trench forming step. The specific layer 281 in the form of a Ti layer is formed in the specific layer forming step. In the second etching step, portions of the Ti layer which cover the side walls of the trench 213 located at the short sides and the side walls of the trench 213 located at the long sides are removed. Then, the conductive portion forming step is carried out between the second etching step and the first insulating layer forming step. The conductive portion forming step includes the ion implanting step, in which ions are implanted into the side walls of the trench 213 located at the short sides, at an angle inclined relative to the vertical, upward direction of the semiconductor substrate. In this manner, the p-type semiconductor regions that extend in the direction of the depth of the semiconductor substrate along the side walls of the trench are formed in respective parts of the side walls of the trench 213 located at the short sides.

Thus, the conductive portions 292 that extend in the direction of the depth of the semiconductor substrate along the side walls of the trench 213 are formed in parts of the side walls of the trench 213, from the p-type semiconductor regions.

Modified Example

Figure 25:
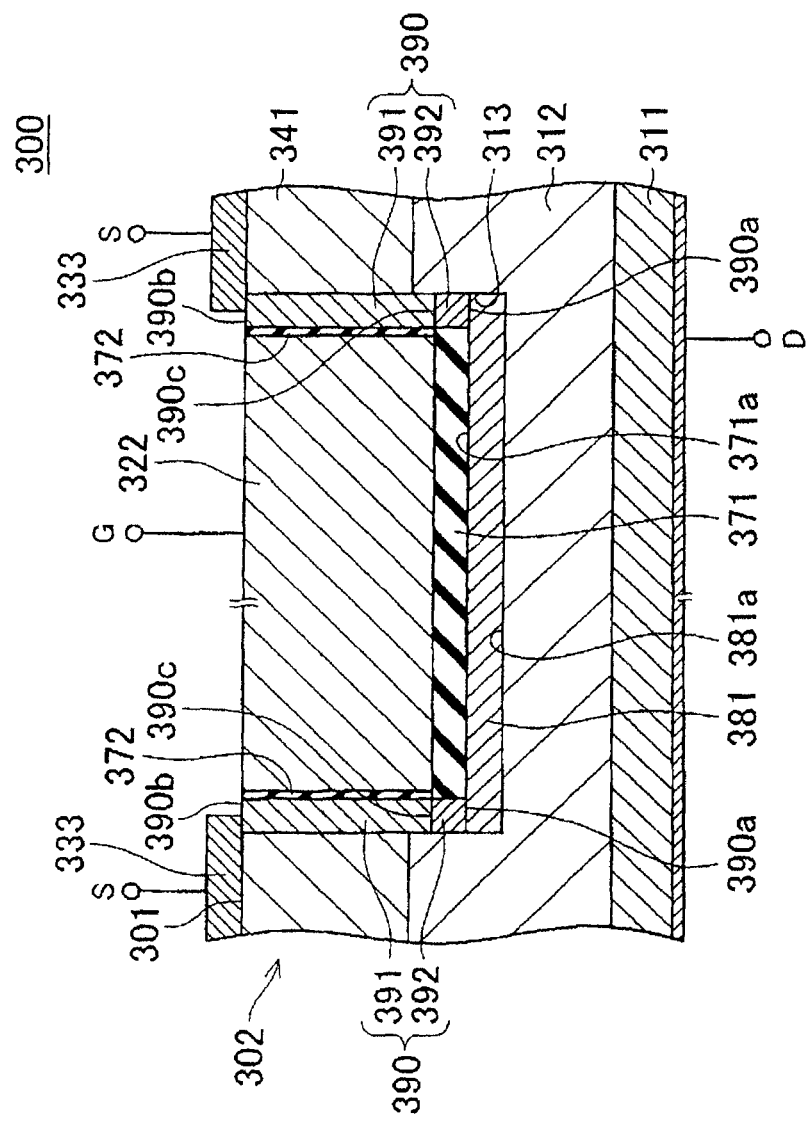
FIG. 25 is a cross-sectional view showing a semiconductor device as a modified example of the first or second embodiment of the invention.

The invention is not limited to an arrangement in which the conductive portions are formed of the same material, over the entire length in the depth direction of the side walls, as in the first and second embodiments. For example, as in a semiconductor device 300 as shown in FIG. 25, conductive portions 390 each having a metal portion 391 and a semiconductor portion 392 may be provided. The lower end, or a first end portion 390a, of the conductive portion 390 coincides with the lower end of the semiconductor portion 392. The first end portion 390a is connected to a specific layer 381. The upper end, or a second end portion 390b, of the conductive portion 390 is exposed to the surface of the semiconductor substrate 302. A source electrode 333 is connected to a part of the surface of the second end portion 390b. The metal portion 391 is a Ti layer, and the semiconductor portion 392 is a p-type semiconductor region. The metal portion 391 and the semiconductor portion 392 are joined to each other at a junction plane 390c, and are electrically connected to each other. The junction plane 390c is located at a lower level than the interface between the drift region 312 and the body region 341. The other arrangement of the semiconductor device 300 is substantially identical with that of the semiconductor device 100; therefore, other components to which the reference numerals that are larger by 200 than those used in FIG. 1 through FIG. 3 are assigned will not be repeatedly explained.

With the semiconductor device 300 constructed as described above, the same effects as provided in the first and second embodiments can be obtained; for example, the occurrence of breakdown has a reduced influence on the gate insulating film 372. Also, since the semiconductor portion 392 is located at a lower level than the interface between the drift region 312 and the body region 341, the specific layer 381 is brought into a floating condition when a forward bias voltage is applied to the transistor, as in the second embodiment. As a result, the Schottky junction between the specific layer 381 and the drift region 312 can be used as a withstand voltage supporting portion.

While the specific embodiments of the invention have been described in detail, these embodiments are merely exemplary, and are not meant to limit the scope of the invention. Rather, the scope of the invention as defined in the appended claims includes various modified examples of the illustrated embodiments.

The semiconductor used in the semiconductor devices 100, 200, 300 according to the first and second embodiments and modified example is not limited to SiC, but may be selected from other types of semiconductors, such as silicon (Si), gallium nitride (GaN), and gallium arsenide (GaAs). Also, the metal layer used as the specific layer and the conductive portion is not limited to the Ti layer, but may be a metal layer formed of another metal, such as molybdenum (Mo), nickel (Ni), or tungsten (W), which cooperates with the drift region to form a Schottky junction. Also, the power MOSFET structure has been described in the illustrated embodiments, the invention is not limited to this application. The same or similar effects can be obtained even if the technology of this invention is applied to an IGBT structure, for example.

For each semiconductor region, p-type and n-type may be switched to each other. Also, the insulating film is not limited to the oxide film, but may be another type of insulating film, such as a nitride film, or may be a composite film.

Other region, for example carrier storage layer, may be disposed between the drift region and the body region as a third region.

The technical elements described in this specification or the drawings are technically useful when taken alone or in various combinations thereof, and are not to be limited to the combination as described in the claims at the time of filing of this application. Also, the technologies illustrated in this specification or the drawing are meant to achieve two or more objects at the same time, and are technically useful when achieving one of these objects.

The invention claimed is:

1. A semiconductor device comprising:
    a semiconductor substrate including a body region of a first conductivity type, a drift region of a second conductivity type having a surface on or above which the body region is laminated, a trench that extends from a surface of the semiconductor substrate into the drift region through the body region, and a source region of the second conductivity type located adjacent to the trench in a range exposed to the surface of the semiconductor substrate, the source region being isolated from the drift region by the body region;
    a source electrode electrically connected to the source region;
    a drain electrode formed on a rear surface of the semiconductor substrate;
    a specific layer that is disposed on a bottom of the trench, and has a characteristic of forming a depletion layer at a junction between the specific layer and the drift region;
    an insulating layer that covers an upper surface of the specific layer and a side wall of the trench;
    a gate electrode formed within the trench covered with the insulating layer; and
    a conductive portion formed on a part of the side wall of the trench in a depth direction of the semiconductor substrate, along the side wall of the trench, the conductive portion having a first end portion that is joined to the specific layer, and a second end portion that reaches the surface of the semiconductor substrate, the conductive portion being connected to the source electrode,
    wherein the specific layer comprises a metal layer, and a Schottky junction is formed at the junction between the specific layer and the drift region.

2. The semiconductor device according to claim 1, wherein the conductive portion comprises the same metal layer as that of the specific layer.

3. The semiconductor device according to claim 1, wherein the conductive portion is formed by a semiconductor region of the first conductivity type, and the first end portion of the conductive portion is joined to the specific layer as the metal layer.

4. The semiconductor device according to claim 1, wherein a thickness of the insulating layer that covers the upper surface of the specific layer is larger than that of the insulating layer that covers the side wall of the trench.

5. The semiconductor device according to claim 1, wherein:
    the trench is formed in a rectangular shape having long sides and short sides, when observed from the surface of the semiconductor substrate;
    the conductive portion is located adjacent to at least a part of the side wall of the trench located at each of the short sides thereof; and
    the source region is located adjacent to at least a part of the side wall of the trench located at each of the long sides thereof.

6. A method of producing a semiconductor device having a semiconductor substrate in which a body region of a first conductivity type is laminated on or above a surface of a drift region of a second conductivity type, and a trench is formed in a range of the semiconductor substrate which is exposed to a surface thereof, a source region of a second conductivity type that is located adjacent to the trench and is electrically connected to a source electrode, a drain electrode formed on a rear surface of the semiconductor substrate, and a gate electrode formed within the trench, comprising:
    a trench forming step of forming at least one trench as said trench which extends from the surface of the semiconductor substrate, into the drift region, through the body region;
    a specific layer forming step of forming a specific layer on a bottom of the trench, the specific layer having a characteristic of forming a depletion layer at a junction between the specific layer and the drift region;
    a conductive portion forming step of forming a conductive portion on a part of a side wall of the trench, the conductive portion being joined to the specific layer;
    a first insulating layer forming step of forming a first insulating layer on inner walls of the trench;
    a first etching step of etching the first insulating layer formed in the first insulating layer forming step, so that the lowest point of an upper surface of the first insulating layer formed in the first insulating layer forming step, within the trench, is located at a lower level than an interface between the drift region and the body region; and
    a second insulating layer forming step of forming a second insulating layer on the side wall of the trench,
    wherein:
    the trench is formed in a rectangular shape having long sides and short sides, when observed from the surface of the semiconductor substrate, in the trench forming step;
    the conductive portion forming step is the same step as the specific layer forming step;

a metal layer that provides the specific layer and the conductive portion is formed on the inner walls of the trench in the specific layer forming step; and a second etching step is further provided for removing portions of the metal layer which cover side walls of the long sides of the trench, such that portions of the metal layer which cover side walls of the short sides of the trench remain.

7. A method of producing a semiconductor device having a semiconductor substrate in which a body region of a first conductivity type is laminated on or above a surface of a drift region of a second conductivity type, and a trench is formed in a range of the semiconductor substrate which is exposed to a surface thereof, a source region of a second conductivity type that is located adjacent to the trench and is electrically connected to a source electrode, a drain electrode formed on a rear surface of the semiconductor substrate, and a gate electrode formed within the trench, comprising:

a trench forming step of forming at least one trench as said trench which extends from the surface of the semiconductor substrate, into the drift region, through the body region;

a specific layer forming step of forming a specific layer on a bottom of the trench, the specific layer having a characteristic of forming a depletion layer at a junction between the specific layer and the drift region;

a conductive portion forming step of forming a conductive portion on a part of a side wall of the trench, the conductive portion being joined to the specific layer;

a first insulating layer forming step of forming a first insulating layer on inner walls of the trench;

a first etching step of etching the first insulating layer formed in the first insulating layer forming step, so that the lowest point of an upper surface of the first insulating layer formed in the first insulating layer forming step, within the trench, is located at a lower level than an interface between the drift region and the body region; and a second insulating layer forming step of forming a second insulating layer on the side wall of the trench, wherein:

the trench is formed in a rectangular shape having long sides and short sides, when observed from the surface of the semiconductor substrate, in the trench forming step; a metal layer that provides the specific layer is formed in the specific layer forming step;

a second etching step is further provided for removing portions of the metal layer which cover side walls of the short sides of the trench and side walls of the long sides of the trench;

the conductive portion forming step is carried out between the second etching step and the first insulating layer forming step; and the conductive portion forming step includes an ion implanting step of implanting ions into each of the side walls of the short sides of the trench, at an angle inclined relative to a vertical upward direction of the semiconductor substrate, so that a semiconductor region of a first conductivity type that extends in a depth direction of the semiconductor substrate along the side wall of the trench is formed on a part of each of the side walls of the short sides of the trench.

* * * * *